(12) United States Patent
Fahn et al.

(10) Patent No.: US 6,194,288 B1
(45) Date of Patent: Feb. 27, 2001

(54) IMPLANT $N_2$ INTO A PAD OXIDE FILM TO MASK THE ACTIVE REGION AND GROW FIELD OXIDE WITHOUT $SI_3N_4$ FILM

(75) Inventors: Fu-Jier Fahn; Fang-Chang Liu, both of Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/224,719

(22) Filed: Jan. 4, 1999

(51) Int. Cl.$^7$ ............................................. H01L 21/76
(52) U.S. Cl. ........................................ 438/440; 438/449
(58) Field of Search ................................. 438/439, 440

(56) References Cited

U.S. PATENT DOCUMENTS

| | | | |
|---|---|---|---|
| 5,308,787 | 5/1994 | Hong et al. | 437/70 |
| 5,523,255 | 6/1996 | Hgung et al. | 437/69 |
| 5,599,731 | 2/1997 | Park | 437/70 |
| 5,677,234 | 10/1997 | Koo et al. | 437/69 |
| 5,789,305 | 8/1998 | Peidous | 438/439 |
| 5,937,310 | * 8/1999 | Gardner et al. | 438/440 |
| 5,937,311 | * 8/1999 | Nagatomo | 438/439 |

\* cited by examiner

*Primary Examiner*—Olik Chaudhuri
*Assistant Examiner*—Anh Duy Mai
(74) *Attorney, Agent, or Firm*—George O. Saile; Stephen B. Ackerman

(57) ABSTRACT

A method whereby the region where the field oxide has to be grown is defined with a layer of photoresist. The present invention teaches the implantation of $N_2$ into the layer of silicon dioxide ($SiO_2$) that is not covered by the layer of photoresist. The photoresist is removed and the field oxide (FOX) is grown in the areas from where the photoresist has been removed.

15 Claims, 2 Drawing Sheets

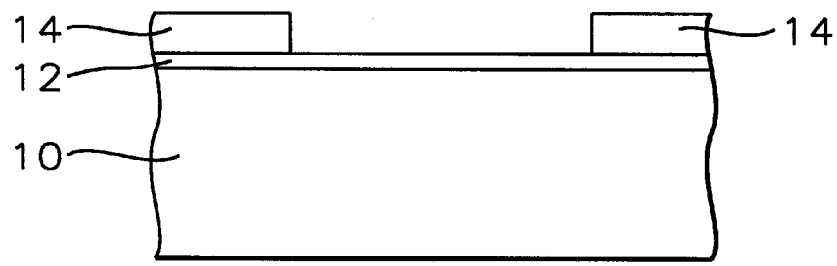
*FIG. 1 - Prior Art*
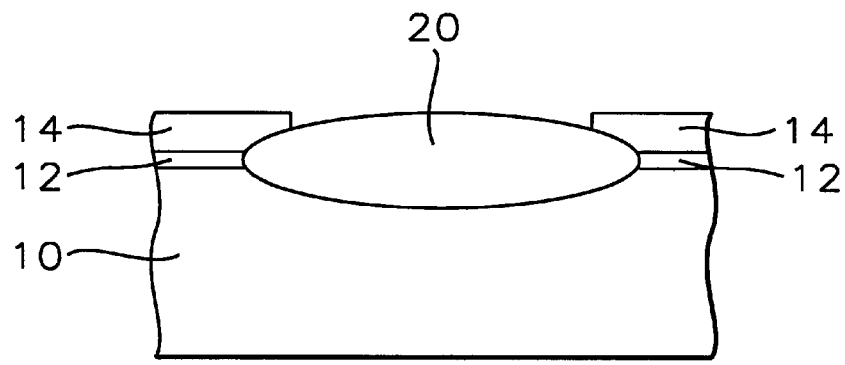
*FIG. 2 - Prior Art*
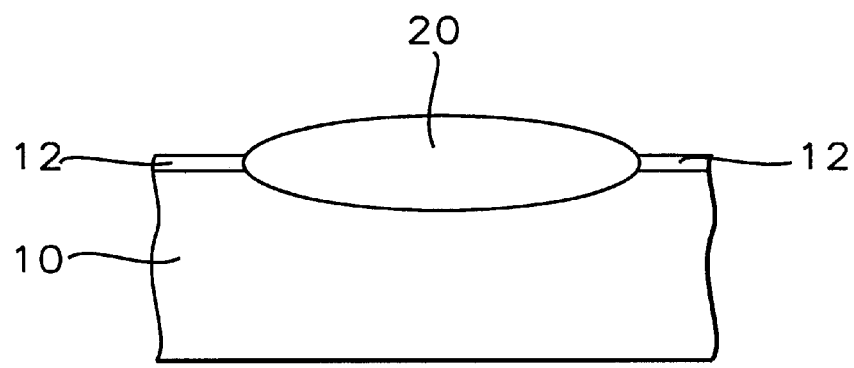
*FIG. 3 - Prior Art*

IMPLANT $N_2$ INTO A PAD OXIDE FILM TO MASK THE ACTIVE REGION AND GROW FIELD OXIDE WITHOUT $SI_3N_4$ FILM

BACKGROUND OF THE INVENTION (1) Field of the Invention

The invention relates to the fabrication of semiconductors, and more specifically to the method applied for localized oxidation of silicon (LOCOS).

(2) Description of the Prior Art

The most widely used method for creating isolation in NMOS and PMOS integrated circuits is the basic LOCOS structure. In the LOCOS approach, the oxide is selectively grown over the field regions of the IC. This is done by covering the active regions with a thin layer of silicon nitride. When the field oxide is grown, the active regions remain covered by nitride, which prevents oxidation of the silicon beneath. In the field regions the surface of the silicon substrate is exposed prior to field oxidation by etching away the nitride layers in these areas. In addition, the silicon in these regions is also selectively implanted at this point with the channel-stop dopant. Thus, the channel-stop regions become self-aligned to the field oxide.

If the field oxide is selectively grown without etching the silicon, the resulting field oxide will be partially recessed. If, on the other hand, the silicon is etched after the oxide-preventing layer is patterned, the field oxide can be grown until it forms a planar surface with the silicon substrate. This is known as the fully recessed isolation oxide process. In the semi-recessed process, the height of the oxide protruding above the level of the active region surface is larger than in the fully recessed process, but it is smaller than in the grow-oxide-and-etch process. In addition, the semi-recessed oxide step has a gentle slope that is more easily covered by subsequent polysilicon and metal layers.

The conventional LOCOS isolation process has a problem known as "bird's beak encroachment". Therefore, the scalability of the LOCOS is limited to about the 1 um range.

The LOCOS process than uses the property that oxygen diffuses through $Si_3N_4$ very slowly. When silicon is covered with silicon nitride no oxide can grow. In addition, nitride itself oxidizes at a very slow rate and will thus remain as an integral oxidation barrier layer throughout the entire oxidation step.

FIG. 1 shows the major processing steps. After a wafer 10 with a bare silicon surface is cleaned, a 20 to 60 nm. layer 12 of $SiO_2$ is thermally grown on its surface. Next, a 100 to 200 nm.-thick layer 14 of Chemical Vapor Deposition (CVD) silicon nitride $Si_3Ni_4$, which functions as an oxidation mask, is deposited. The active regions are then defined with a photolithographic step so that they are protected by the photoresist patterns. The composite oxide/nitride layers are then plasma-etched as a stack. With the photoresist pattern in place, the wafer is subsequently implanted with a $10^{12}$ to $10^{13}$ cm$^{-2}$ dose of boron with energies in the range of 60 to 100 keV. This channel stop is now self-aligned to the n-channel devices. The underlying layer of oxide within the stack, called a pad or buffer oxide, is used to cushion the transition of stresses between the silicon substrate and the nitride film.

FIG. 2 shows how, after the channel stop implant, the field oxide 20 with a thickness of 500 to 900 nm. is thermally grown by wet oxidation at temperatures of 900 to 1000 degrees C. for 4 to 8 hours.

FIG. 3 shows the next stage of the processing sequence, the masking nitride layer is stripped with phosphoric acid at 180 degrees C. using a reflux boiler. Then the pad oxide is etched (not shown).

U.S. Pat. No. 5,599,731 (Han et al.) discloses a N I/I into the pad oxide only in areas where the bird's beak will be formed.

U.S. Pat. No. 5,523,255 (Hyung et al.) shows a conventional Pad Oxide with overlying oxidation barrier layer.

U.S. Pat. No. 5,308,787 (Hong et al.) shows a nitrogen ion implant (N I/I) into the substrate in areas where the FOX is grown. The N I/I reduces the oxidation rate.

U.S. Pat. No. 5,677,234 (Koo et al.) shows a N containing layer (formed by N I/I) over the buffer layer.

U.S. Pat. No. 5,789,305 (Peidous) shows a N I/I into the substrate in bird's beak areas.

SUMMARY OF THE INVENTION

It is the primary objective of the present invention to simplify the process of growing Field Oxide.

Another objective of the present invention is to reduce high-temperature processing during the process of growing Field Oxide.

In accordance with the objectives of the present invention, the invention first grows a layer of thermal silicon oxide ($SiO_2$), the same as Prior Art, after which the region where the field oxide has to be grown is defined with a layer of photoresist. The photoresist used for this step by the present invention is thicker than the layer of photoresist that is deposited during this step within the Prior Art processing sequence. The present invention teaches the implantation of $N_2$ into the layer of silicon dioxide ($SiO_2$) that is not covered by the layer of photoresist. Next the photoresist is removed and the field oxide (FOX) is grown in the areas from where the photoresist has been removed. During this latter step of growing the FOX, the $N_2$ that has previously been implanted will be diffused out.

DESCRIPTION OF THE PREFERRED EMBODIMENTS

Figure 4:
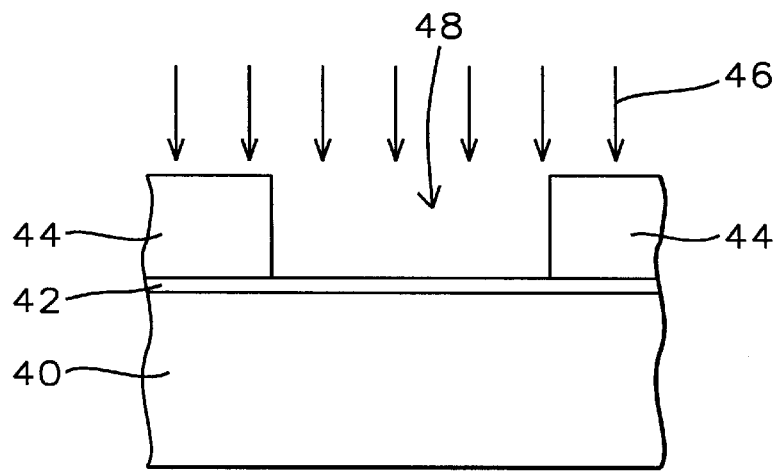
FIG. 4 shows the cross section of the semiconductor substrate during $N_2$ implantation.

Referring now specifically to FIG. 4, there is shown a cross section of the semiconductor substrate 40.

On the bare or cleaned surface of wafer 40, a 20 to 60 nm. layer 42 Of $SiO_2$ has thermally been grown. Next, a heavy layer 44 of Chemical Vapor Deposition (CVD) silicon nitride $Si_3Ni_4$, is deposited. Layer 44 is a photoresist and will, after etching (see below), serve as an oxidation mask for the underlying layer of silicon oxide 42. Layer 42 is about 1.0 to 2.0 um thick.

The region 46 is then defined with a photolithographic step so that this region is unprotected by the photoresist patterns. The photoresist layer 44 is then plasma-etched. With the photoresist pattern 44 in place, the wafer is subsequently implanted (46) with a dose of $N_2$ within the range of between $8 \times 10^{15}$ and $1.6 \times 10^{16}$ cm$^{-2}$ with energies in the range of about 30 to 50 keV.

Figure 5:
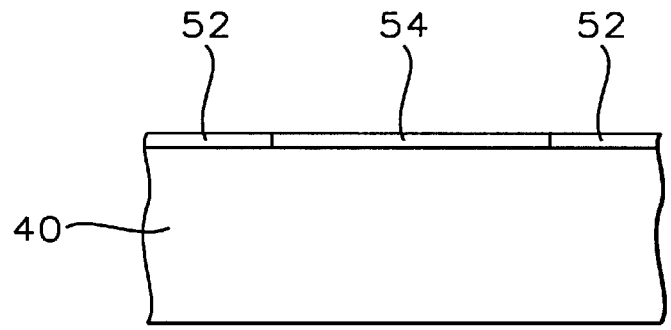
FIG. 5 shows the cross section of the semiconductor substrate after the photoresist has been removed.

FIG. 5 shows the next stage of the processing sequence, the masking photoresist layer 44 (FIG. 4) is stripped.

The removal of the photoresist 44 exposes the top surface of layer 42 in the areas 52. These areas have not been exposed to the $N_2$ implant and therefore remain $SiO_2$. Area 54 is the area that has been exposed to the $N_2$ implant. $SiO_2$ in this area has been converted to SiON by the $N_2$ implant, this further reduces effects of stress on the surface of the silicon substrate, this as compared with the Prior Art $Si_3N_4$ buffer layer.

Figure 6:
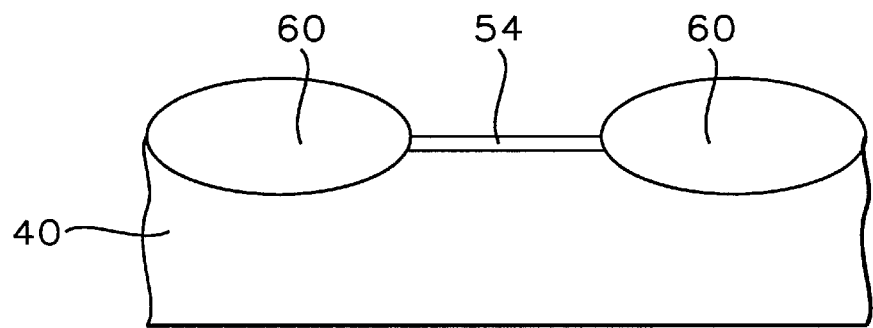
FIG. 6 shows the cross section of the semiconductor substrate after the field oxide has been grown.

FIG. 6 shows the growing of the field oxide 60 with a thickness within the range between 300 and 800 nm. The field oxide is thermally grown by wet oxidation at temperatures of 900 to 1000 for 4 to 8 hours.

Note that the field oxide 60 is, as opposed to Prior Art processing results, grown in the areas (52, FIG. 5) of the substrate that have previously been covered with the photoresist. The image of the field oxide is therefore the mirror image of the field oxide grown using the Prior Art process.

As a final step in the creation of the field oxide layer, the field oxide is etched (not shown).

From the foregoing it will be clear that, although a specific embodiment of the present invention has been described herein for purposes of illustration, various modifications to the present invention may be made without deviating from the spirit and scope of the present invention. Accordingly, the present invention is not limited except as by the appended claims.

What is claimed is:

1. A method of fabricating a field oxide layer of a semiconductor device, comprising the steps of:
   providing a silicon substrate;
   forming a layer of dielectric over the surface of said substrate, said dielectric being sensitive to implanting of nitrogen ions, said dielectric further being sensitive to oxidation;
   depositing a layer of material that blocks implanted nitrogen ions from reaching the surface of said dielectric;
   patterning said layer of material that blocks nitrogen ion implant from reaching the surface of said dielectric, creating openings in said layer overlying said dielectric where no field oxide is to be grown in said layer of dielectric, said material that blocks ion implant from reaching the surface of said dielectric remaining in place on the surface of said dielectric over surface regions of said dielectric where field oxide is to be grown;
   selectively implanting nitrogen in the surface of said dielectric in said areas where no field oxide is to be grown;
   removing said layer of material that blocks nitrogen ion implant from reaching said dielectric from the surface of said layer of dielectric;
   growing field oxide regions under the surface of said layer of dielectric within said areas wherein field oxide is to be grown; and
   planarizing said field oxide regions.

2. The method of claim 1 wherein said dielectric comprises silicon dioxide.

3. The method of claim 2 wherein said silicon dioxide is thermally grown to a thickness of between about 20 to 60 nm. on the surface of said substrate.

4. The method of claim 1 wherein depositing a layer of material that blocks nitrogen ion implant from reaching said dielectric is depositing a layer of photoresist overlying said layer of dielectric said layer of photoresist to be deposited to a thickness between about 1.0 and 2.0 um.

5. The method of claim 1 wherein said patterning said layer of material that blocks nitrogen ion implant from reaching said dielectric is etching said layer of material that blocks nitrogen ion implant from reaching said dielectric thereby creating openings within said layer of material that blocks nitrogen ion implant from reaching said dielectric that are above and mate with those areas within said layer of dielectric wherein no field oxide regions are to be formed said openings to reach down to the top surface of said layer of dielectric thereby creating exposed areas of the surface of said layer of dielectric.

6. The method of claim 1 wherein said selectively implanting nitrogen is selectively implanting nitrogen into said said areas where no field oxide is to be grown with a dose of nitrogen ($N_2$) within the range of between $8 \times 10^{15}$ and $1.6 \times 10^{16}$ $cm^{-2}$ with implant energy in the range of between 30 to 50 keV whereby said nitrogen implanting also exposes but is blocked by said patterned layer of material that blocks nitrogen ion implant from reaching said dielectric that has been created on the surface of said layer of dielectric.

7. The method of claim 1 wherein growing field oxide regions is growing field oxide over surface areas of said layer of dielectric from which said patterned layer of material that blocks nitrogen ion implant from reaching said dielectric has been removed said field oxide to be grown to a thickness of between about 500 and 900 nm. by wet oxidation of said surface of said dielectric at temperatures of 900 to 1000 degrees C. for 4 to 8 hours.

8. The method of claim 1 with the additional step of implanting said substrate with a $10^{12}$ to $10^{13}$ $cm^{-2}$ dose of boron with energies in the range of 60 to 100 keV thus creating a channel stop within said substrate said step after said creation of patterning field oxide regions.

9. A method of fabricating a pattern of field oxide layers of a semiconductor device, comprising the steps of:
   providing a semiconductor substrate; forming a silicon dioxide layer over the surface of said silicon substrate;
   depositing a layer of photoresist overlying said silicon dioxide layer;
   patterning said photoresist layer to provide openings, exposing portions of said silicon dioxide layer, said openings forming a mirror image of said pattern of field oxide layers;
   selectively implanting nitrogen into said silicon dioxide layer within said openings;
   removing said patterned layer of photoresist from the surface of said silicon dioxide layer;
   growing field oxide regions under surface areas of said layer of silicon dioxide from which said patterned layer of photoresist has been removed; and planarizing said field oxide regions.

10. The method of claim 9 wherein forming a silicon dioxide layer over the surface of said silicon substrate is thermally growing a 20 to 60 nm. layer of $SiO_2$ on the surface of said substrate.

11. The method of claim 9 wherein depositing a layer of photoresist overlying said silicon oxide layer is depositing a layer of photoresist with a thickness between about 1.0 and 2.0 um.

12. The method of claim 9 wherein said patterning said photoresist layer is exposing and etching said photoresist thereby creating openings within said photoresist that are above and mate with said patterned areas within said silicon dioxide wherein no field oxide regions are to be formed.

13. The method of claim 9 wherein said selectively implanting nitride is selectively implanting nitrogen into said exposed areas of the top surface of said silicon dioxide with a dose of nitrogen ($N_2$) within the range of between $8 \times 10^{15}$ and $1.6 \times 10^{16}$ cm$^{-2}$ with implant energy in the range of between 30 to 50 keV whereby said nitrogen implanting also exposes but is inhibited by said patterned photoresist that has been created on the top surface of said layer of silicon dioxide.

14. The method of claim 9 wherein growing field oxide regions is growing field oxide with a thickness of 500 to 900 nm. by wet oxidation of said surface of said silicon dioxide at temperatures of 900 to 1000 degrees C. for 4 to 8 hours.

15. The method of claim 9 with the additional step of implanting said substrate with a $10^{12}$ to $10^{13}$ cm$^{-2}$ dose of boron with energies in the range of 60 to 100 keV thus creating a channel stop within said substrate said step after said removing said photoresist pattern.

* * * * *